(12) United States Patent
Pabustan et al.

(10) Patent No.: US 9,123,423 B2
(45) Date of Patent: Sep. 1, 2015

(54) PROGRAMMING OPERATIONS IN A MEMORY DEVICE

(71) Applicant: Micron Technolgy, Inc., Boise, ID (US)

(72) Inventors: Jonathan Pabustan, San Lorenzo, CA (US); Vishal Sarin, Cupertino, CA (US); Dzung H. Nguyen, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 74 days.

(21) Appl. No.: 14/104,444

(22) Filed: Dec. 12, 2013

(65) Prior Publication Data

US 2014/0104956 A1 Apr. 17, 2014

Related U.S. Application Data

(62) Division of application No. 13/550,718, filed on Jul. 17, 2012, now Pat. No. 8,611,156, which is a division of application No. 12/720,239, filed on Mar. 9, 2010, now Pat. No. 8,243,523.

(51) Int. Cl.
| | |
|---|---|
| *G11C 7/10* | (2006.01) |
| *G11C 16/10* | (2006.01) |
| *G11C 16/26* | (2006.01) |
| *G11C 16/34* | (2006.01) |

(52) U.S. Cl.
CPC ............. *G11C 16/10* (2013.01); *G11C 16/26* (2013.01); *G11C 16/3454* (2013.01)

(58) Field of Classification Search
CPC ....... G11C 16/26; G11C 7/12; G11C 16/3454
See application file for complete search history.

(56) References Cited

U.S. PATENT DOCUMENTS

| | | | |
|---|---|---|---|
| 6,104,664 A | 8/2000 | Ohno | |
| 6,717,848 B2 | 4/2004 | Kim et al. | |
| 7,558,152 B2 | 7/2009 | Lee et al. | |
| 7,656,713 B2 | 2/2010 | Cernea | |
| 7,864,589 B2 | 1/2011 | Sarin et al. | |
| 2006/0285391 A1* | 12/2006 | Cernea | 365/185.22 |
| 2009/0021987 A1 | 1/2009 | Sarin et al. | |
| 2009/0141558 A1 | 6/2009 | Sarin et al. | |
| 2009/0231926 A1 | 9/2009 | Sarin et al. | |
| 2011/0255341 A1* | 10/2011 | Jones | 365/185.19 |

FOREIGN PATENT DOCUMENTS

| | | |
|---|---|---|
| WO | 2008/054986 A2 | 5/2008 |
| WO | 2009/026364 A1 | 2/2009 |

* cited by examiner

*Primary Examiner* — Tuan T Nguyen
(74) *Attorney, Agent, or Firm* — Dicke, Billig & Czaja, PLLC

(57) ABSTRACT

Methods for sensing, method for programming, memory devices, and memory systems are disclosed. In one such method for sensing, a counting circuit generates a count output and a translated count output. The count output is converted into a time varying voltage that biases a word line coupled to memory cells being sensed. Target data for each memory cell is stored in a data cache associated with that particular memory cell. When it is detected that a memory cell has turned on, the translated count output associated with the count output that is indicative of the voltage level that turned on the memory cell is compared to the target data. The comparison determines the state of the memory cell.

20 Claims, 9 Drawing Sheets

PROGRAMMING OPERATIONS IN A MEMORY DEVICE

RELATED APPLICATION

This is a Divisional of U.S. application Ser. No. 13/550,718, titled "SENSING OPERATIONS IN A MEMORY DEVICE," Filed Jul. 17, 2012 (Allowed), which is a Divisional of U.S. application Ser. No. 12/720,239, filed Mar. 9, 2010, now U.S. Pat. No. 8,243,523, issued on Aug. 14, 2012, which are commonly assigned and incorporated herein by reference.

TECHNICAL FIELD

The present embodiments relate generally to memory and a particular embodiment relates to sensing operations in a memory.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

A flash memory is a type of memory that can be erased and reprogrammed in blocks instead of one byte at a time. A typical flash memory comprises a memory array, which includes a large number of memory cells. Changes in threshold voltage of the memory cells, through programming of charge storage nodes (e.g., floating gates or charge traps) or other physical phenomena (e.g., phase change or polarization), determine the data value of each cell. The cells are usually grouped into blocks. Each of the cells within a block can be electrically programmed, such as by charging the charge storage node. The data in a cell of this type is determined by the presence or absence of the charge in the charge storage node. The charge can be removed from the charge storage node by an erase operation.

Each memory cell can be programmed as a single bit per cell (i.e., single level cell—SLC) or multiple bits per cell (i.e., multilevel cell—MLC). Each cell's threshold voltage ($V_t$) is representative of the data that is stored in the cell. For example, in a single bit per cell, a $V_t$ of 1.5V can indicate a programmed cell while a $V_t$ of −0.5V might indicate an erased cell.

A multilevel cell has multiple $V_t$ ranges that each indicates a different state. Multilevel cells can take advantage of the analog nature of a traditional flash cell by assigning a bit pattern to a specific $V_t$ range for the cell. This technology permits the storage of data values representing two or more bits per cell, depending on the quantity of $V_t$ ranges assigned to the cell.

As the performance of processors increases, the performance of the memory coupled to the processor should also increase, without impacting program or read reliability, to keep from becoming a bottleneck during data transfers. The density of flash memory arrays has also historically been increasing by increasing the quantity of bits storable in each memory cell. This results in greater quantities of data to be transferred to the memory array and programmed within a certain time period.

For the reasons stated above, and for other reasons stated below that will become apparent to those skilled in the art upon reading and understanding the present specification, there is a need in the art for alternative methods and apparatus for sensing memory cells in a memory device.

DETAILED DESCRIPTION

Figure 1:
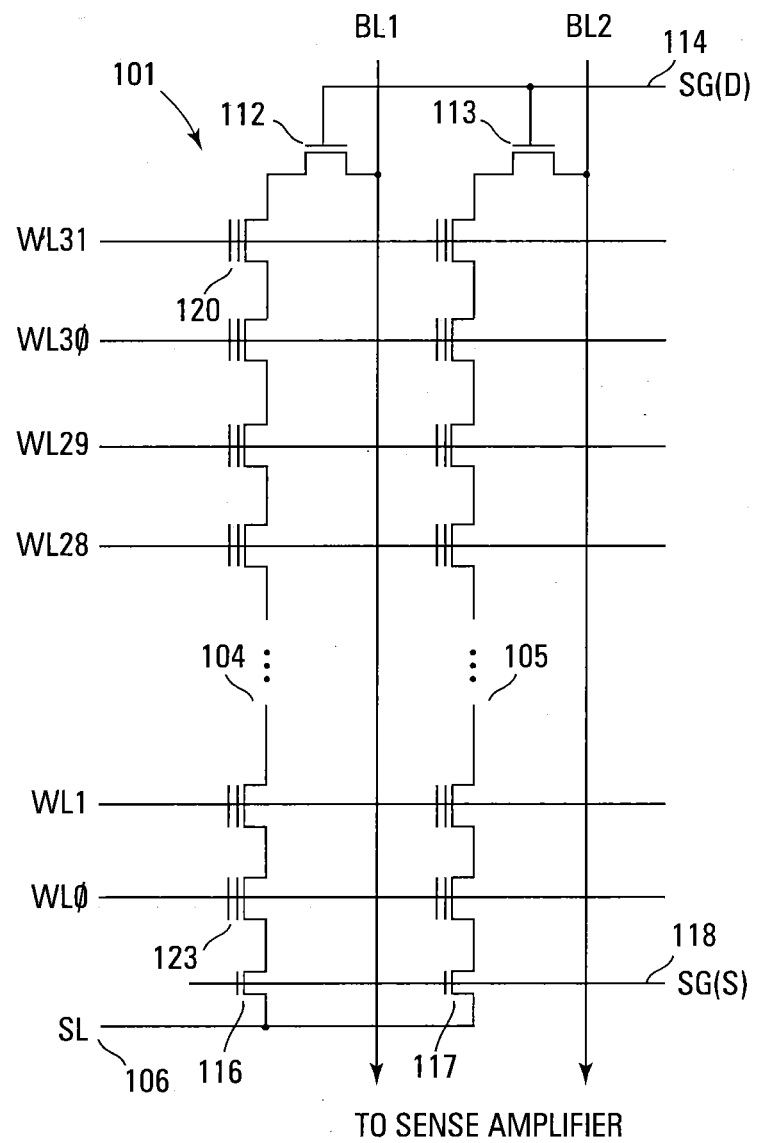
FIG. 1 shows a schematic diagram of one embodiment of a portion of a memory array.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a schematic diagram of a portion of a NAND architecture memory array 101 comprising series strings of non-volatile memory cells that can be sensed using the embodiments of the sensing operation discussed subsequently. While the subsequent discussions refer to a NAND memory device, the present embodiments are not limited to such an architecture but can be used in other memory device architectures as well.

Figure 2:
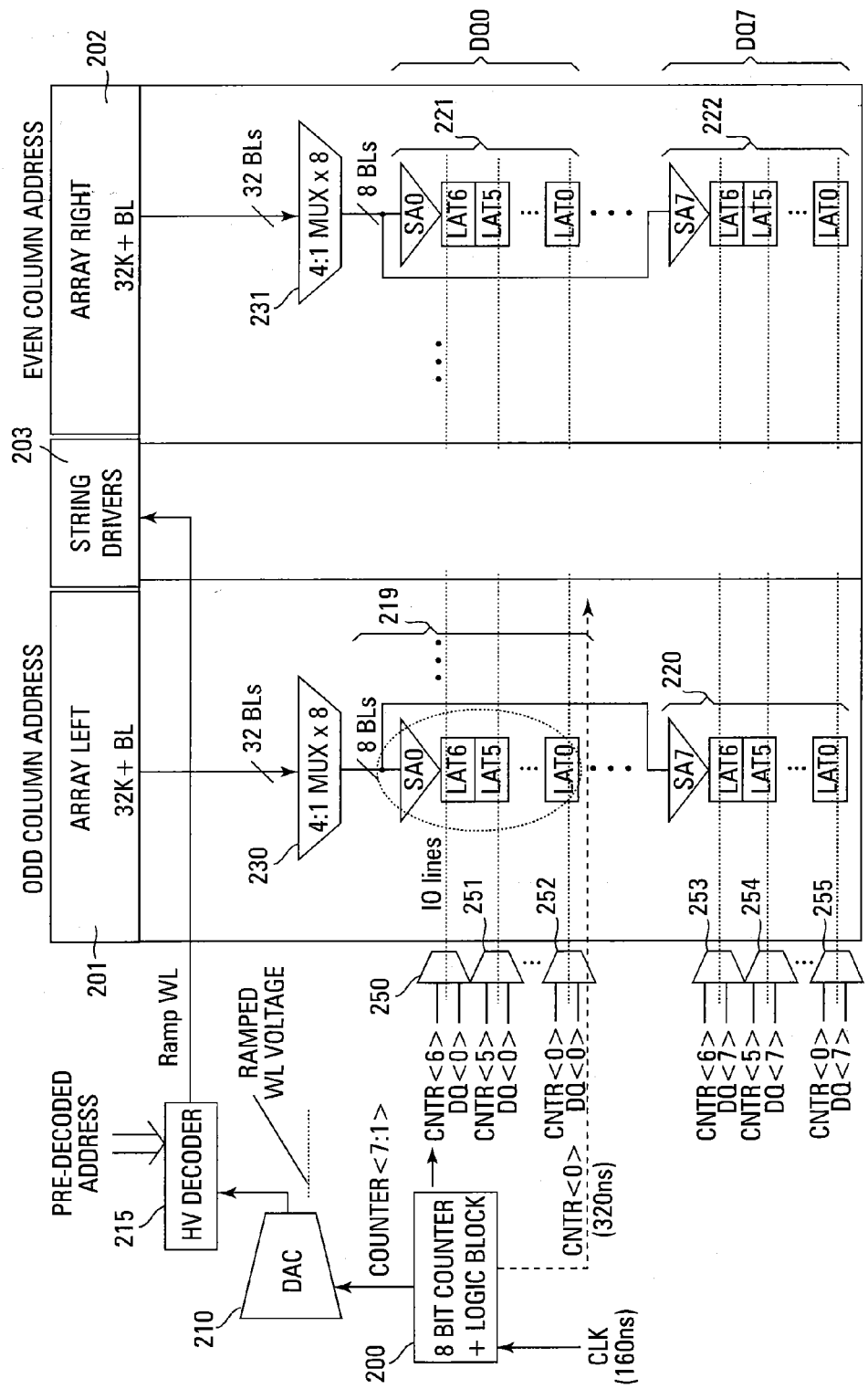
FIG. 2 shows a block diagram of one embodiment of odd and even sensing paths in a memory device.
Figure 3:
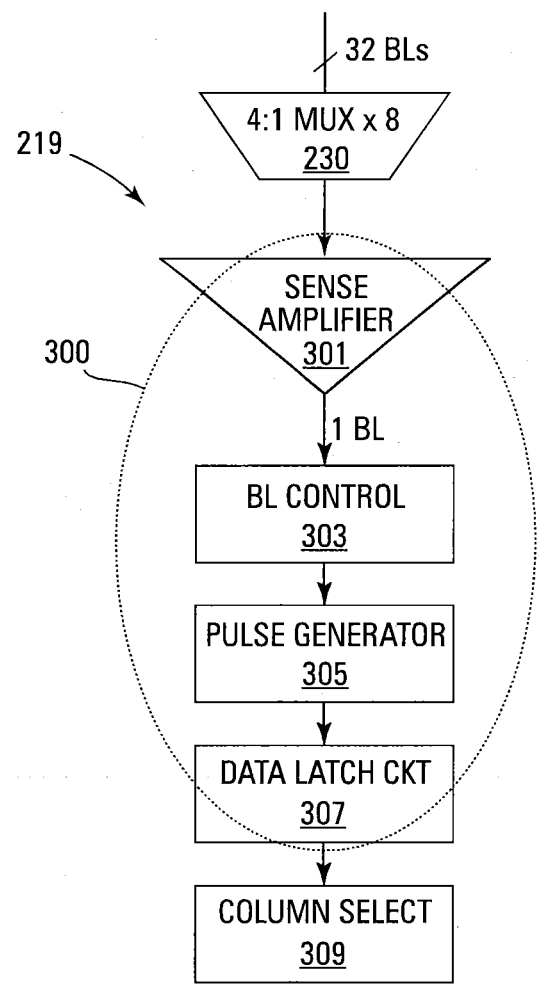
FIG. 3 shows a block diagram of one embodiment of a data cache in accordance with the sensing path of FIG. 2.

The array can be comprised of an array of non-volatile memory cells 101 (e.g., floating gate) arranged in columns such as series strings 104, 105. Each of the cells 101 are coupled drain to source in each series string 104, 105. An access line (e.g. word line) WL0-WL31 that spans across multiple series strings 104, 105 is coupled to the control gates of each memory cell in a row in order to bias the control gates of the memory cells in the row. Data lines, such as bit lines BL1, BL2 are coupled to the strings and eventually coupled to sense amplifier circuitry, as shown in FIGS. 2 and 3, that detect the state of each cell by sensing current or voltage on a particular bit line.

Each series string 104, 105 of memory cells is coupled to a source line 106 by a source select gate 116, 117 and to an individual bit line BL1, BL2 by a drain select gate 112, 113. The source select gates 116, 117 are controlled by a source select gate control line SG(S) 118 coupled to their control gates. The drain select gates 112, 113 are controlled by a drain select gate control line SG(D) 114.

Even though the subsequently described sensing embodiments refer to single level cell (SLC) embodiments, each memory cell can be programmed as an SLC or multiple level cell (MLC). Each cell's threshold voltage ($V_t$) is indicative of the data that is stored in the cell. For example, in an SLC, a $V_t$ of 1.5V might indicate a programmed cell while a $V_t$ of –0.5V might indicate an erased cell. The MLC uses multiple $V_t$ ranges that each indicate a different state. Multilevel cells can take advantage of the analog nature of a traditional flash cell by assigning a bit pattern to a specific $V_t$ range. This technology permits the storage of data values representing two or more bits per cell, depending on the quantity of $V_t$ ranges assigned to the cell.

The embodiments of the sensing operations described subsequently use a time varying access line voltage (e.g., ramped word line voltage) architecture to turn on select memory cells during the sense operation. The ramped voltage, generated by a counter and a digital-to-analog converter, for example, can be applied to any type of sensing operation. For example, both read operations and program verify operations are encompassed by these embodiments.

FIG. 2 illustrates a block diagram of one embodiment of odd 201 and even 202 sensing paths of a memory device. The odd sensing path 201 is used for sensing odd column addresses while the even sensing path 202 is used for sensing even column addresses.

Each sensing path 201, 202 includes, for the embodiment depicted in FIG. 2 having eight data words, eight data cache circuits 219, 220 and 221, 222 a multiplexing circuit 230, 231 that, in one embodiment, selects between 32 bit lines. Each sensing path 201, 202 of FIG. 2, for purposes of clarity, only shows two data cache circuits 219, 220 and 221, 222, respectively, for each sensing path. Each multiplexing circuit 230, 231 can include, for such an embodiment, eight 4:1 multiplexers that are each coupled to four bit line inputs and one data cache circuit on the output so that one bit line is selected from the four input bit lines for each multiplexer. Each row of data cache circuits is coupled to a data output DQ0-DQ7 of the memory device. An example of one data cache 219 and multiplexing circuit 230 is illustrated in FIG. 3 and discussed subsequently.

The sensing paths 201, 202 are also coupled to peripheral circuitry that includes a counting circuit 200 (e.g., 8-bit counter and logic block), a digital-to-analog converter (DAC) circuit 210, and a high voltage decoder circuit 215. The counting circuit 200 is clocked by a clock input CLK (e.g., 160 ns period). One bit of the 8-bit count (e.g., COUNTER<0>) is used as a clock (e.g., 320 ns period) for clocking circuitry in the data cache circuits 219-222.

The seven remaining bits of the 8-bit count (e.g., COUNTER<7:1>) are output to the DAC 210 that acts as a voltage generation circuit. In one embodiment, the counting circuit 200 counts from 0 to 127. The DAC 210 generates a time varying signal by converting the digital count, over time, to an analog voltage signal such as a ramped voltage (e.g., a 0V-5V ramped voltage).

The ramped voltage is input to the high voltage decoder circuit 215 that applies the ramped voltage to a selected word line. The high voltage decoder circuit 215 has pre-decoded address inputs that enable the high voltage decoder circuit 215 to determine which block and which word line in the block is to be biased with the ramped voltage.

The output of the high voltage decoder circuit 215 is input to a string driver circuit 203. The string driver circuit 203 drives the word lines and passes different levels of voltages during program, read, and program verify operations. In one embodiment, one out of 64 word lines in a block is biased with the ramped voltage during sensing while the unselected word lines in a block are biased with a pass voltage $V_{pass}$ selected to activate memory cells coupled to those unselected word lines regardless of their data values, e.g., a $V_{pass}$ voltage from 5V to 6V (depending on the embodiment).

The logic block portion of the counting circuit 200 is responsible for generating a translated count (e.g., CNTR<6:0> data) from the COUNTER<7:1> count of the 8-bit counter. The logic block portion can translate the COUNTER<7:1> output as follows: CNTR<0>=COUNTER<1>; CNTR<1>=COUNTER<2>; CNTR<2>=COUNTER<3>; CNTR<3>=COUNTER<4>; CNTR<4>=COUNTER<5>; and CNTR<5>=COUNTER<6>. CNTR<6> can be set according to the sense operation being performed and/or the count value of COUNTER<7:1>, for example.

For example, if a program verify operation is being performed, CNTR<6> can be set to a logic 1. During a read operation, CNTR<6> can be set to a logic 0 if COUNTER<7:1> is less than a threshold count value (e.g., 16) and CNTR<6> can be set to a logic 1 if COUNTER<7:1> is greater than or equal to the threshold count value (e.g. 16). The values for CNTR<6> are subsequently discussed in more detail.

The peripheral circuitry is further comprised of additional multiplexing circuitry comprising a plurality of multiplexers 250-255 that are each configured to select between an input data signal from the DQ0-DQ7 data inputs of the memory device and a respective counter bit (e.g., CNTR<x>) from the 8-bit counter circuit 200. The output of each multiplexer 250-255 of the multiplexing circuitry is input to a different latch LAT0-LAT6 of each data cache circuit 219-222.

For example, referring to the DQ<0> data cache circuits 219, 221, CNTR<6:1> and DQ<0> are input to the multiplexers 250-252 so that control circuitry (not shown in FIG. 2) can select between latching input data from DQ<0> or a counter output bit to its respective latch LAT0-LAT6. Similarly, referring to the DQ<7> data cache circuits 220, 222, CNTR<6:1> and DQ<7> are input to the multiplexers 253-255 so that the control circuitry can select between latching input data from DQ<7> or a counter output bit to its respective latch LAT0-LAT6. As will be discussed subsequently, the latched data from the DQ inputs are target count data that are compared to the counter output CNTR during a sense operation in order to determine a present voltage of the ramped word line voltage and, thus, a state of a sensed memory cell.

FIG. 3 illustrates a block diagram of one embodiment of a data cache circuit 219 that can be incorporated in the sensing paths of the embodiment of FIG. 2. FIG. 3 also illustrates a multiplexing circuit 230 as discussed previously with reference to FIG. 2. This circuit 230 can be configured for bit line multiplexing as well as controlling bit line biasing during sensing or programming operations.

The data cache 300 is comprised of a sense circuit (e.g., sense amplifier circuitry) 301 coupled to a bit line control circuit 303 that is coupled to a pulse generator 305 that is coupled to a data latch circuit having data latches and a comparator 307. The data cache 300 is repeated multiple times (e.g., 8 times) in the y-direction. A column select circuit 309 is coupled to the last data cache 300 in the column.

The sense amplifier circuitry 301 detects either current or voltage on a bit line selected by the multiplexing circuit 230. The detected current or voltage is an indication whether the selected memory cell has been turned on by the ramped voltage signal applied to its control gate.

The bit line control circuit 303 includes a pass/fail latch for program verify and erase verify operations. When one of these verify operations has passed, the latch is set to indicate a successful verify.

The pulse generator circuit 305 generates a synchronous pulse whenever the sense amplifier circuitry 301 detects a current/voltage. In other words, when a selected memory cell turns on from a particular voltage biasing the control gate of the selected memory cell, a current flows in the bit line. This current is detected by the sense amplifier circuitry 301 that causes the pulse generator to generate a synchronous pulse indicating that the memory cell has turned on.

The data latch circuit 307 of the data cache 300 can be comprised of a plurality of data latches (e.g., seven latches) and a comparator circuit. The data latches can store a digital representation of a target threshold voltage that is loaded from one of the data inputs DQ0-DQ7 of the memory device (e.g. a target count). The digitally represented target threshold voltage is the threshold voltage to which a memory cell is to be programmed.

The column select circuit 309 is coupled to the output of the data latch circuit. During a sense operation, the column select circuit 309 selects groups of columns based on an input address and an indication from the data latch circuit 307 comparator that a selected memory cell has been programmed to its target threshold voltage.

Figure 4:
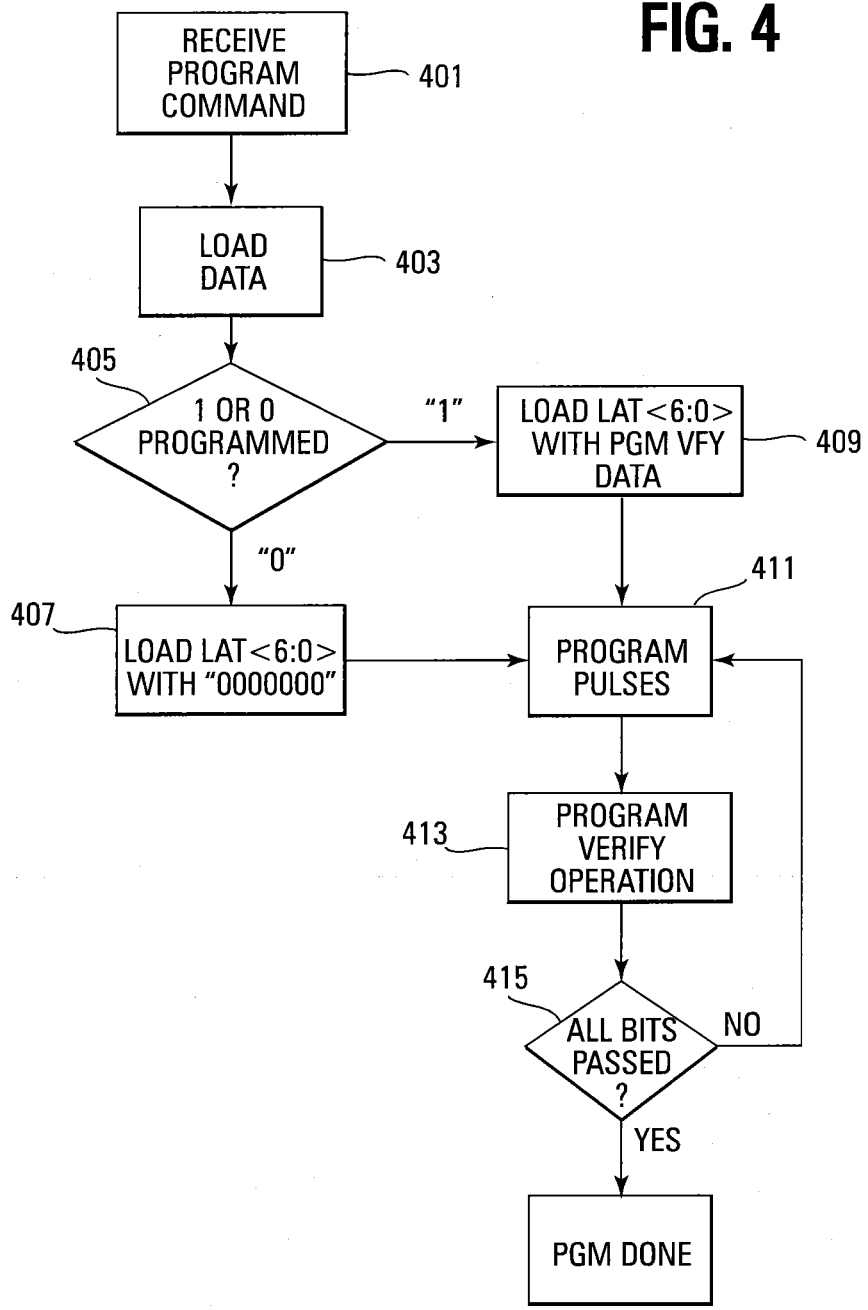
FIG. 4 shows a flow chart of one embodiment of a program operation.

FIG. 4 illustrates a flow chart of one embodiment of a method for programming a memory device. This method also refers to the circuits of FIGS. 2 and 3 to describe the execution of the program operation.

An initial program command is transmitted to the memory device that receives and decodes the command 401. Data to be programmed is then transmitted to the memory device 403 for programming. In one embodiment, 2k bytes of data are loaded sequentially and programmed simultaneously.

It is determined whether a logical 0 or a logical 1 is being programmed to each memory cell 405. If a logical 1 is being programmed to the memory cell, the logical 1 is loaded into the most significant bit (LAT<6>) of the latches 307 as illustrated in FIG. 3. At the same time, the other latches (LAT<5: 0> for that memory cell are also loaded with the data that will be used during a program verify operation. In the case of a programmed logical 1, the latches LAT<6:0> are loaded 409 with program verify data representative of a desired threshold voltage. For example, the latches LAT<6:0> could be loaded 409 with a logical 1010000 as the program verify data. The program verify data is representative of one embodiment of the lowest threshold voltage that will be verified as a programmed logical 1.

The logical 1 loaded to the LAT<4>location causes the programmed memory cell to be verified to a higher threshold voltage which provides a margin between a read operation and a program verify operation. The 1010000 program verify data written to the latches can be altered by data stored in registers typically referred to as trim data. The trim data can increase or decrease the voltage to which a memory cell is program verified by altering the data stored in the latches LAT<6:0>. Thus, by altering the program verify data prior to being stored in the latches, the threshold voltage range for the programmed state can be adjusted in both voltage level and resolution.

If a logical 0 was written to the memory cell, the logical 0 is loaded into the most significant bit (LAT<6>) of the latches 307 as illustrated in FIG. 3. In an embodiment where the erased cell does not need to be programmed (e.g., to a less negative threshold), none of the other latches need to be set to a logical 1. Thus, the latches LAT<6:0> for a programmed 0 state can be loaded 407 with a logical 0000000 as the program verify data.

The programming of the memory cells is then performed by the program pulses 411 applied to the memory cell's control gate through the selected word line. These pulses might start with an amplitude of 15V and incrementally increase to 20V in order to increase the threshold voltage of a memory cell that is being programmed with a logical 1. A program verify operation 413 is performed after each program pulse. One embodiment of a program verify operation is illustrated by the flow chart of FIG. 5 and described subsequently.

If the program verify operation passes 415, the program operation is successful and has been completed. If the program verify operation fails, the previous programming pulse voltage is incremented by a step voltage and that higher voltage programming pulse is applied to the memory cell 411. The program pulse/verify operation is repeated until the memory cell passes the program verify operation or the memory cell is flagged as not programmable.

Figure 5:
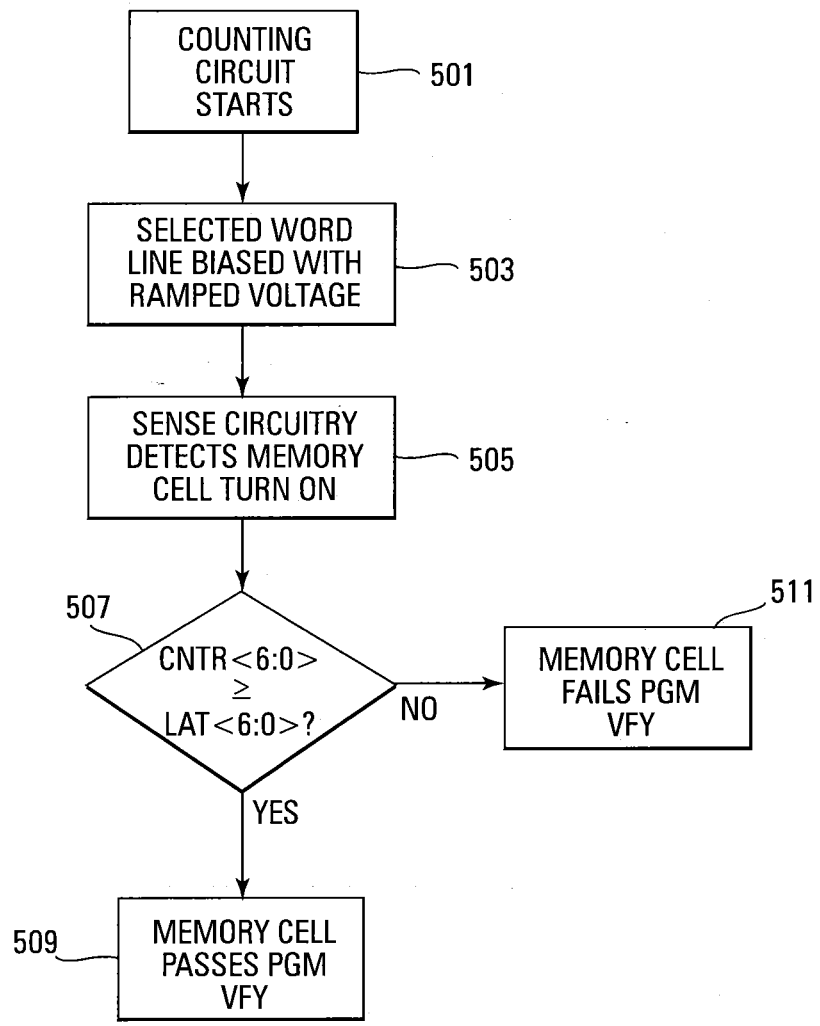
FIG. 5 shows a flow chart of one embodiment of a program verify operation in accordance with the program operation of FIG. 4.

FIG. 5 illustrates a flow chart of one embodiment of a program verify operation in accordance with the program operation of FIG. 4. Referring to both FIG. 5 and the block diagram of FIG. 2, it should be noted that the COUNTER output coupled to the digital-to-analog converter is not the same as the CNTR output coupled to the latches of the data cache circuitry. Once such translation from COUNTER<7:1> to CNTR<6:0> was shown and discussed previously with reference to FIG. 2.

The counting circuit starts 501. As discussed previously, COUNTER<0> clocks the data cache circuits. COUNTER<7:1> increments from 0 to 127 and is coupled to the digital-to-analog converter to generate the ramped voltage. By forcing CNTR<6> to a logical 1, the count CNTR<6: 0> sent to the latches for comparison is actually counting from 64 to 127 in this example.

The ramped voltage from the digital-to-analog converter that is applied to the selected word line starts to ramp from a voltage below the first programmed level (e.g., 0V) to a maximum voltage (e.g., 5V), based on the COUNTER<7:1> value 503. When the word line voltage reaches the threshold voltage to which a selected memory cell has been programmed, it turns on. The memory cell turning on causes a bit line voltage or a current to flow on the bit line that is detected by the sense amplifier circuitry 505.

A comparison is then performed 507 between CNTR<6:0> and a target count value stored in LAT<6:0>. The target count value can be program verify data. If CNTR<6:0> is greater than or equal to LAT<6:0>, the memory cell has passed the program verify operation 509. If the CNTR<6:0>is less than LAT<6:0>, the selected memory cell fails the program verify operation 511 and should be biased with at least one additional programming pulse as discussed in the programmed operation of FIG. 4.

In one embodiment, memory cells that have LAT<6:0> less than 1010000 (i.e., 80 in decimal) need additional programming until their respective sense amplifier circuitry detects a current at a CNTR value greater than or equal to 80. Since erased memory cells are at a logical 0 state and have LAT<6:0>=0000000, in at least some embodiments, these memory cells always pass the verify operation.

Figure 6:
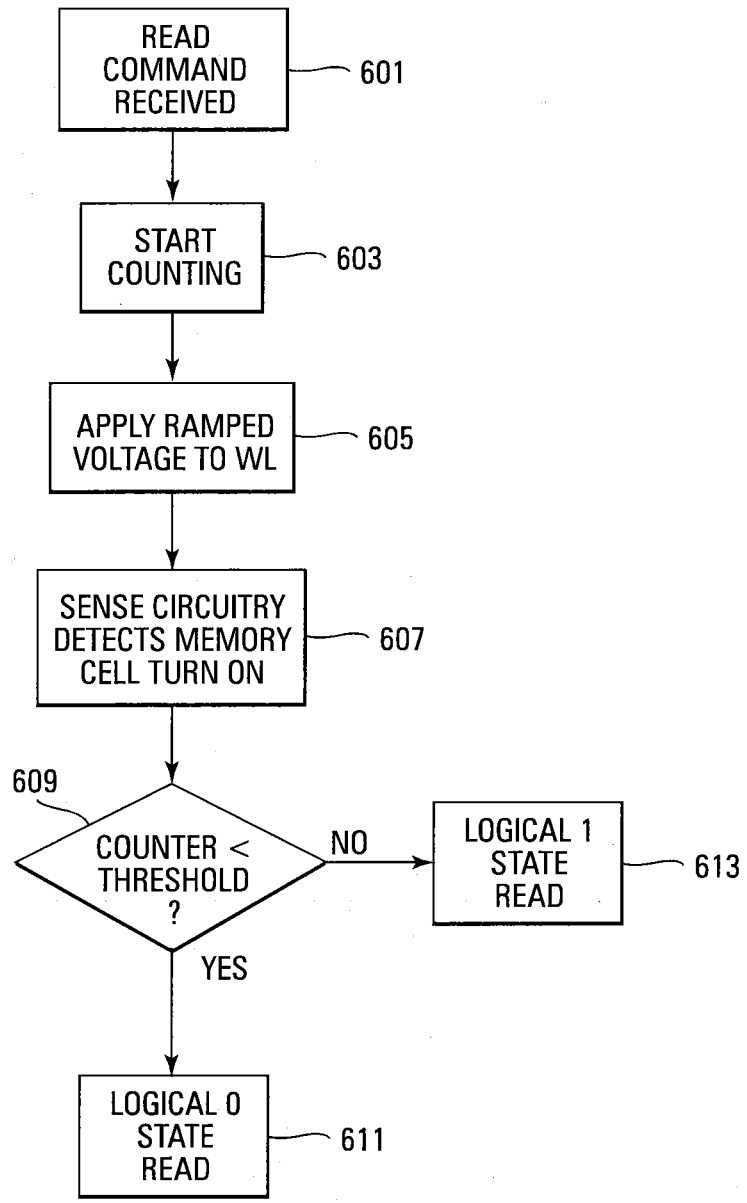
FIG. 6 shows a flow chart of one embodiment of a read operation.

FIG. 6 illustrates a flow chart of one embodiment of a read operation. After the memory device has received and decoded a read command 601, the counter COUNTER<7:0> starts counting 603. In one embodiment, COUNTER<7:1> goes from 0 to 127. Alternate embodiments might use other count values.

The voltage from the digital-to-analog converter is applied to the selected word line 605 such that a ramped voltage biases the control gate of the memory cell selected to be read. When the ramped voltage reaches the threshold voltage of the selected memory cell, the memory cell turns on thus causing a current to flow on the bit line. The respective sense amplifier circuitry detects the memory cell turning on 607 (e.g., current or voltage) that causes a comparison to occur between the CNTR<6:0> and the LAT<6:0> 609 in which a threshold count value has been stored.

If the CNTR<6:0> is less than the threshold count value (e.g., 16), a logical 0 has been stored in the data cache latch LAT<6> and the memory cell can be read as being in a logical 0 state 611. If the CNTR<6:0> is greater than or equal to the threshold, a logical 1 has been stored in the data cache latch LAT<6> and the memory cell can be read as being a logical 1 state 613. In another embodiment, the counter value could be used as the data value.

Figure 7:
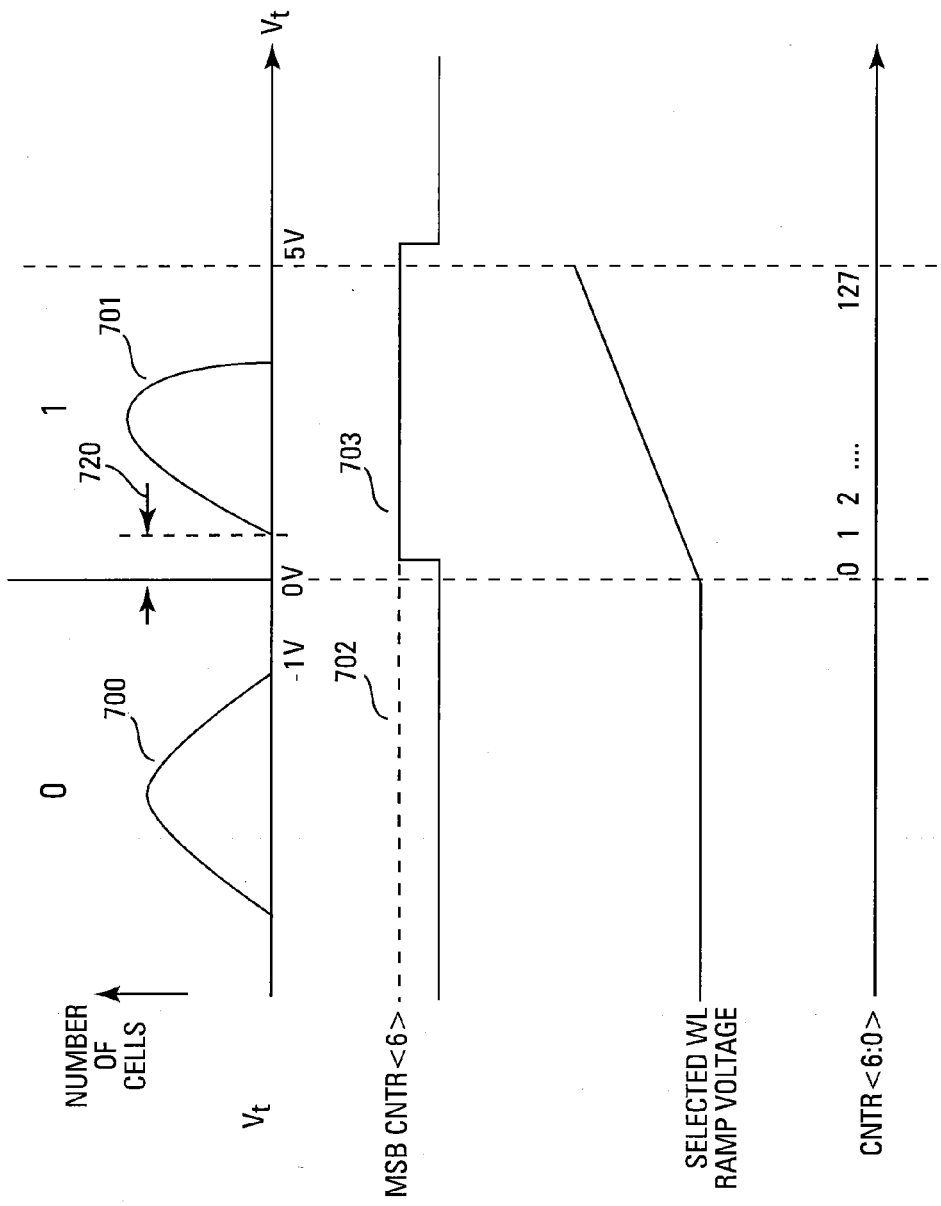
FIG. 7 shows a combination timing diagram and threshold voltage range distribution of one embodiment for sensing operations in a memory device.
Figure 8:
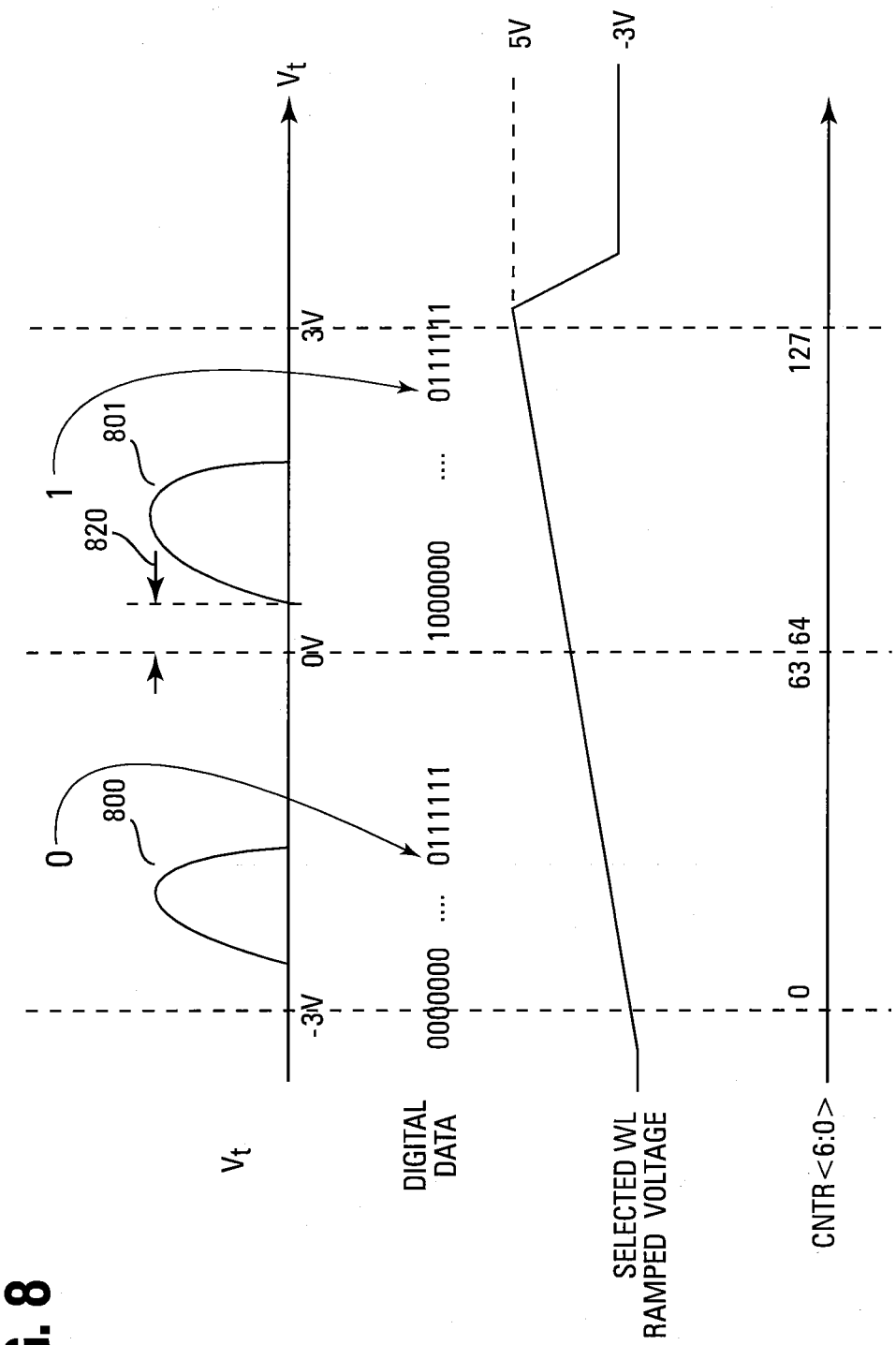
FIG. 8 shows a combination timing diagram and threshold voltage range distribution of an alternate embodiment for sensing operations in a memory device.

FIG. 7 illustrates a combination timing diagram and threshold voltage range distribution of one embodiment of a sensing operation in a memory device, such as the non-volatile memory device of FIG. 1. The threshold voltage ranges 700, 701 of the first waveform are shown in relation to 0V. In the illustrated embodiment, an erased memory cell is read as a logical 0. For example, a cell having a threshold voltage within a negative threshold voltage range 700. The programmed state of the memory cell is read as a logical 1. For example, a cell having a threshold voltage within a positive threshold voltage range 701. The $V_t$ ranges 700, 701 are plotted with the threshold voltage along the x-axis and the number of cells of each $V_t$ along the y-axis. The SLC states used in the embodiments illustrated in FIGS. 7 and 8 are the opposite of a typical prior art SLC memory cell in which the erased state is read as a logical 1.

By setting program verify data CNTR<6:0>to 1010000 (i.e., 80 decimal), as described previously with reference to FIG. 5, a margin 720 has been created between 0V and the lowest threshold voltage of the programmed threshold voltage range 701. For example, if CNTR count 0000000 corresponds to 0V then 1010000 might correspond to 0.6V thus creating a 0.6V margin between the lowest programmed $V_t$ and the read voltage (assuming the read voltage is 0V), thus mitigating any shifts in data values after programming.

The solid line in the second waveform shows that the most significant bit of the translated counter output CNTR<6> coupled to the latches can be set high 703 after, for example, count 16 of COUNTER<7:1> for a read operation as described previously. As shown by the dashed line, in at least one embodiment, this bit CNTR<6> can always be high 702 during a program verify operation.

The third waveform shows the selected word line ramp voltage as it increases as the CNTR<6:0> to the latches counts from 0 to 127. Alternate embodiments could count to different maximum values instead of 127 for embodiments having a ramped voltage, or other time varying voltage, that goes to a different maximum voltage (e.g., 2V-3V).

FIG. 8 illustrates a combination timing diagram and threshold voltage range distribution of an alternate embodiment of a sensing operation in a memory device, such as the non-volatile memory device of FIG. 1. This embodiment differs from the embodiment illustrated in FIG. 2 in that the ramped word line voltage starts as a negative value (e.g., −3V) and ramps to a positive value (e.g., 5V).

The first waveform shows that the erased state is a logical 0 but has a more negative threshold voltage range 800 than the previous embodiment. In this embodiment, the lowest threshold of the erased threshold voltage range is around −3V. Thus, the ramped voltage should start at the more negative voltage. The programmed state is a logical 1 and has a positive threshold voltage range 801. The first waveform also shows that by forcing the program verify data to 1001000 instead of 1000000, a margin is created between 0V and the lowest threshold voltage of the programmed threshold range 801.

The next line shows the digital data associated with the COUNTER<7:1> output of the counting circuit. In this embodiment, the logic 0 of the erased state is set into bit COUNTER<7> of the erased digital data. The logic 1 of the programmed state is set into bit COUNTER<7> of the programmed digital data.

The third waveform of FIG. 8 shows the selected word line ramped voltage. In one embodiment, this ramped voltage goes from −3V to 5V. Alternate embodiments can use other start and stop voltages.

The final waveform shows the CNTR<6:0> output from the logic block portion of the counting circuit of FIG. 2. This waveform shows that CNTR<6:0>goes from 0-63 for the erased state and 64-127 for the programmed state.

Figure 9:
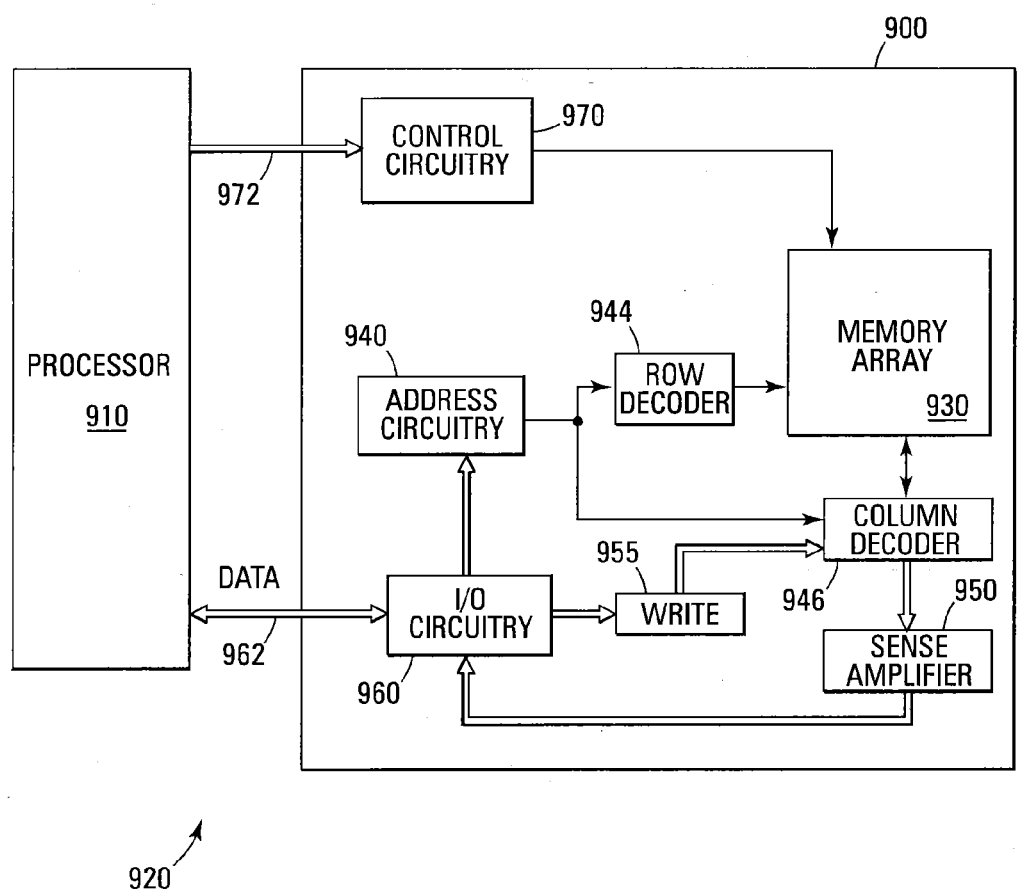
FIG. 9 shows a block diagram of one embodiment of a memory system.

FIG. 9 illustrates a functional block diagram of a memory device 900. The memory device 900 is coupled to an external processor 910. The processor 910 may be a microprocessor or some other type of controller. The memory device 900 and the processor 910 form part of a memory system 920. The memory device 900 has been simplified to focus on features of the memory that are helpful in understanding the present invention.

The memory device 900 includes an array 930 of non-volatile memory cells, such as the one illustrated previously in FIG. 1. The memory array 930 is arranged in banks of word line rows and bit line columns. In one embodiment, the columns of the memory array 930 are comprised of series strings of memory cells. As is well known in the art, the connections of the cells to the bit lines determines whether the array is a NAND architecture, an AND architecture, or a NOR architecture.

Address buffer circuitry 940 is provided to latch address signals provided through I/O circuitry 960. Address signals are received and decoded by a row decoder 944 and a column decoder 946 to access the memory array 930. It will be appreciated by those skilled in the art, with the benefit of the present description, that the number of address input connections depends on the density and architecture of the memory array 930. That is, the number of addresses increases with both increased memory cell counts and increased bank and block counts.

The memory device 900 reads data in the memory array 930 by sensing voltage or current changes in the memory array columns using sense amplifier circuitry 950. The sense amplifier circuitry 950, in one embodiment, is coupled to read and latch a row of data from the memory array 930. Data input and output buffer circuitry 960 is included for bidirectional data communication as well as the address communication over a plurality of data connections 962 with the controller 910. Write circuitry 955 is provided to write data to the memory array.

Memory control circuitry 970 decodes signals provided on control connections 972 from the processor 910. These signals are used to control the operations on the memory array 930, including data read, data write (program), and erase operations. The memory control circuitry 970 may be a state machine, a sequencer, or some other type of controller to generate the memory control signals. In one embodiment, the memory control circuitry 970 is configured to execute the sense operations of the memory device as described previously.

The flash memory device illustrated in FIG. 9 has been simplified to facilitate a basic understanding of the features of the memory. A more detailed understanding of internal circuitry and functions of flash memories are known to those skilled in the art.

CONCLUSION

In summary, one or more embodiments of the sensing operation can provide reduced time for verify and read operations while, in at least one embodiment, also producing only positive voltages for the sensing operation. In the case of a verify operation, for example, this can be accomplished by writing digital data into a series of latches where the digital data is indicative of the data stored in a corresponding memory cell. A counter and digital-to-analog converter can be used to generate a time varying voltage that is applied to a selected word line coupled to the corresponding memory cell. A count value associated with the counter can be compared to the digital data during a program verify operation to determine if the program operation was successful. Similarly, during a read operation, if the count value that generates the voltage that turns on the corresponding memory cell is greater than a threshold, the selected memory cell is considered programmed.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art.

Accordingly, this application is intended to cover any adaptations or variations of the invention. It is manifestly intended that this invention be limited only by the following claims and equivalents thereof.

What is claimed is:

1. A method for programming a memory cell, the method comprising:
    storing target data into latches associated with the memory cell wherein the target data is one of data to be programmed or data representative of a minimum programmed threshold voltage;
    biasing a control gate of the memory cell with a programming pulse to program the target data; and
    performing a program verify operation on the memory cell.

2. The method of claim 1, wherein the target data is the data to be programmed if the data to be programmed corresponds to an erased state and the target data is data representative of the minimum programmed threshold voltage if the data to be programmed corresponds to a programmed state.

3. The method of claim 1, wherein the program verify operation comprises:
    starting a counter to generate a counter output;
    translating the counter output such that a most significant bit of a translated output is a logical 1;
    determining when the memory cell turns on;
    comparing the translated output to the target data; and
    determining that the memory cell passes the program verify operation if the translated output is greater than or equal to the target data.

4. The method of claim 1, wherein the memory cell is programmed and verified as a single level cell.

5. The method of claim 1, wherein an erased cell is represented by a logic "0" and a programmed cell is represented by a logic "1".

6. The method of claim 1, wherein programming further comprises storing a logic "1" in cells that are programmed, and storing a logic "0" in cells that are erased.

7. The method of claim 1, and further comprising not programming erased cells that are to store a logic "0".

8. The method of claim 1, wherein biasing a control gate of the memory cell with a programming pulse comprises programming with a ramped programming voltage that is only a positive voltage.

9. The method of claim 8, wherein the ramped programming voltage ramps from 0 volts to approximately 5 volts.

10. The method of claim 1, and further comprising:
    when a logic "0" is being programmed into a memory cell, not loading latches of a data latch circuit of the memory with trim data.

11. The method of claim 1, wherein storing target data into latches further comprises loading one latch of a data cache circuit with trim data when a logic "1" is to be programmed to the memory cell.

12. The method of claim 11, wherein storing target data into latches further comprises loading the logic "1" to be programmed to the memory cell into a latch corresponding to a most significant bit.

13. The method of claim 1, wherein storing target data into latches further comprises not loading latches of a data cache circuit with trim data when a logic "0" is to be programmed to the memory cell.

14. The method of claim 3, and further comprising forcing the most significant bit of the translated output to a logic "1" for performing a program verify operation.

15. The method of claim 3, and further comprising:
    for a read operation, forcing the most significant bit of the translated output to a logic "0" when the counter is less than a threshold count value, and forcing the most significant bit of the translated output to a logic "1" when the counter is greater than or equal to the threshold count value.

16. A method for programming a memory cell, the method comprising:
    storing target data into latches associated with the memory cell wherein the target data is one of data to be programmed or data representative of a minimum programmed threshold voltage;
    biasing a control gate of the memory cell with a programming pulse to program the data; and
    performing a program verify operation on the memory cell;
    wherein performing a program verify operation comprises:
        determining when the memory cell turns on; and
        determining that the memory cell passes the program verify operation based on comparison of a counter output translated to have a most significant bit as a logical 1 and the target data when the translated counter output is greater than or equal to the target data.

17. The method of claim 16, and further comprising forcing the most significant bit of the translated counter output to a logic "1" for performing the program verify operation.

18. The method of claim 16, and further comprising:

for a read operation, forcing the most significant bit of the translated counter output to a logic "0" when the counter output is less than a threshold count value, and forcing the most significant bit of the translated counter output to a logic "1" when the counter output is greater than or equal to the threshold count value.

19. A method for programming a memory cell, the method comprising:
   storing target data into latches associated with the memory cell wherein the target data is one of data to be programmed or data representative of a minimum programmed threshold voltage;
   biasing a control gate of the memory cell with a programming pulse to program the data; and
   performing a program verify operation on the memory cell;
   wherein storing target data into latches comprises:
      determining whether a logical 1 or a logical 0 is to be programmed to the memory cell;
      loading a logical 1 in a most significant bit of the latches associated with the memory cell when a logical 1 is to be programmed to the memory cell, and loading remaining latches of the latches associated with the memory cell with program verify data; and
      lading a logical 0 in the most significant bit of the latches associated with the memory cell when a logical 0 is to be programmed to the memory cell.

20. The method of claim 19, wherein performing a program verify operation comprises:
   starting a counter to generate a counter output;
   translating the counter output such that a most significant bit of a translated output is a logical 1;
   determining when the memory cell turns on;
   comparing the translated output to the target data; and
   determining that the memory cell passes the program verify operation when the translated output is greater than or equal to the target data.

* * * * *

UNITED STATES PATENT AND TRADEMARK OFFICE
CERTIFICATE OF CORRECTION

| | |
|---|---|
| PATENT NO. | : 9,123,423 B2 |
| APPLICATION NO. | : 14/104444 |
| DATED | : September 1, 2015 |
| INVENTOR(S) | : Jonathan Pabustan et al. |

Page 1 of 1

It is certified that error appears in the above-identified patent and that said Letters Patent is hereby corrected as shown below:

IN THE CLAIMS

Column 10, line 54, delete "data" and insert in place thereof --target data--.

Column 11, line 14, delete "data" and insert in place thereof --target data--.

Column 12, line 6, delete "lading" and insert in place thereof --loading--.

Signed and Sealed this
Twenty-second Day of March, 2016

Michelle K. Lee
*Director of the United States Patent and Trademark Office*